(12) United States Patent
Shioya et al.

(10) Patent No.: US 8,360,324 B2
(45) Date of Patent: Jan. 29, 2013

(54) WIRELESS IC DEVICE

(75) Inventors: Shigeyuki Shioya, Muko (JP); Noboru Kato, Moriyama (JP); Yuya Dokai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 681 days.

(21) Appl. No.: 12/551,037

(22) Filed: Aug. 31, 2009

(65) Prior Publication Data

US 2009/0302121 A1 Dec. 10, 2009

Related U.S. Application Data

(63) Continuation of application No. PCT/JP2008/054994, filed on Mar. 18, 2008.

(30) Foreign Application Priority Data

| Apr. 9, 2007 | (JP) | 2007-101843 |
| Apr. 20, 2007 | (JP) | 2007-112050 |

(51) Int. Cl.
*G06K 19/06* (2006.01)
*G08B 13/14* (2006.01)
*H01L 35/00* (2006.01)
*H01Q 1/36* (2006.01)

(52) U.S. Cl. .......... 235/492; 340/572.1; 340/572.7; 340/572.8; 343/700 R; 343/796; 343/895

(58) Field of Classification Search .......... 235/492; 343/895, 700 R, 796; 340/572.1–572.8
See application file for complete search history.

(56) References Cited

U.S. PATENT DOCUMENTS

| 3,364,564 A | 1/1968 | Kurtz et al. |
| 4,794,397 A | 12/1988 | Ohe et al. |

(Continued)

FOREIGN PATENT DOCUMENTS

| DE | 10 2006 057 369 A1 | 6/2008 |
| EP | 0 694 874 A2 | 1/1996 |

(Continued)

OTHER PUBLICATIONS

Official Communication issued in International Application No. PCT/JP2007/066007, mailed on Nov. 27, 2007.

(Continued)

*Primary Examiner* — Michael G Lee
*Assistant Examiner* — Laura Gudorf
(74) *Attorney, Agent, or Firm* — Keating & Bennett, LLP

(57) ABSTRACT

A wireless IC device that is operable in a wide band and is suitable for RFID systems includes a radiating plate and an electromagnetically coupled module constituted by a wireless IC that processes transmitted/received signals and a feeding circuit board having a feeding circuit and coupled with the wireless IC. The radiating plate includes a linear electrode bent at a bent portion and apparently sectioned into two linear electrode portions having different lengths. The electromagnetically coupled module is arranged such that the feeding circuit board and the linear electrode portions are electromagnetically coupled. The wireless IC is operated by signals received by the radiating plate, and response signals from the wireless IC are radiated outward from the radiating plate.

3 Claims, 13 Drawing Sheets

U.S. PATENT DOCUMENTS

| | | | |
|---|---|---|---|
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2003/0006901 A1 | 1/2003 | Kim et al. |
| 2003/0020661 A1 | 1/2003 | Sato |
| 2003/0169153 A1 | 9/2003 | Muller |
| 2004/0001027 A1 | 1/2004 | Killen et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0000915 A1* | 1/2006 | Kodukula et al. ............ 235/492 |
| 2006/0001138 A1 | 1/2006 | Sakama et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2008/0024156 A1 | 1/2008 | Arai et al. |
| 2008/0087990 A1 | 4/2008 | Kato et al. |
| 2008/0169905 A1 | 7/2008 | Slatter |
| 2008/0272885 A1 | 11/2008 | Atherton |
| 2008/0316135 A1* | 12/2008 | Hilgers ..................... 343/795 |
| 2009/0002130 A1 | 1/2009 | Kato |
| 2009/0009007 A1 | 1/2009 | Kato et al. |
| 2009/0065594 A1 | 3/2009 | Kato et al. |

FOREIGN PATENT DOCUMENTS

| | | |
|---|---|---|
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 280 232 A1 | 1/2003 |
| EP | 1 343 223 A1 | 9/2003 |
| EP | 1 357 511 A2 | 10/2003 |
| JP | 50-143451 A | 11/1975 |
| JP | 62-127140 U | 8/1987 |
| JP | 02-164105 A | 6/1990 |
| JP | 03-262313 A | 11/1991 |
| JP | 04-150011 A | 5/1992 |
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 08-088586 A | 4/1996 |
| JP | 11-149537 A | 6/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 09-245381 A | 9/1997 |
| JP | 09-252217 A | 9/1997 |
| JP | 09-270623 A | 10/1997 |
| JP | 9-512367 A | 12/1997 |
| JP | 10-069533 A | 3/1998 |
| JP | 10-505466 A | 5/1998 |
| JP | 10-171954 A | 6/1998 |
| JP | 10-193849 A | 7/1998 |
| JP | 10-293828 A | 11/1998 |
| JP | 11-039441 A | 2/1999 |
| JP | 11-075329 A | 3/1999 |
| JP | 11-085937 A | 3/1999 |
| JP | 11-102424 A | 4/1999 |
| JP | 11-103209 A | 4/1999 |
| JP | 11-149536 A | 6/1999 |
| JP | 11-149538 A | 6/1999 |
| JP | 11-219420 A | 8/1999 |
| JP | 11-220319 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |

| | | | | | | |
|---|---|---|---|---|---|---|
| JP | 2000-090207 A | 3/2000 | | JP | 2003-132330 A | 5/2003 |
| JP | 2000-132643 A | 5/2000 | | JP | 2003-134007 A | 5/2003 |
| JP | 2000-137778 A | 5/2000 | | JP | 2003-155062 A | 5/2003 |
| JP | 2000-137779 A | 5/2000 | | JP | 2003-158414 A | 5/2003 |
| JP | 2000-137785 A | 5/2000 | | JP | 2003-187207 A | 7/2003 |
| JP | 2000-148948 A | 5/2000 | | JP | 2003-187211 A | 7/2003 |
| JP | 2000-172812 A | 6/2000 | | JP | 2003-188338 A | 7/2003 |
| JP | 2000-222540 A | 8/2000 | | JP | 2003-198230 A | 7/2003 |
| JP | 2000-510271 A | 8/2000 | | JP | 2003-209421 A | 7/2003 |
| JP | 2000-243797 A | 9/2000 | | JP | 2003-216919 A | 7/2003 |
| JP | 2000-251049 A | 9/2000 | | JP | 2003-218624 A | 7/2003 |
| JP | 2000-276569 A | 10/2000 | | JP | 2003-233780 A | 8/2003 |
| JP | 2000-286634 A | 10/2000 | | JP | 2003-242471 A | 8/2003 |
| JP | 2000-286760 A | 10/2000 | | JP | 2003-243918 A | 8/2003 |
| JP | 2000-311226 A | 11/2000 | | JP | 2003-249813 A | 9/2003 |
| JP | 2000-321984 A | 11/2000 | | JP | 2003-529163 A | 9/2003 |
| JP | 3075400 U | 11/2000 | | JP | 2003-288560 A | 10/2003 |
| JP | 2000-349680 A | 12/2000 | | JP | 2003-309418 A | 10/2003 |
| JP | 2001-028036 A | 1/2001 | | JP | 2003-317060 A | 11/2003 |
| JP | 2007-18067 A | 1/2001 | | JP | 2003-331246 A | 11/2003 |
| JP | 2001-043340 A | 2/2001 | | JP | 2003-332820 A | 11/2003 |
| JP | 2001-66990 A | 3/2001 | | JP | 2004-040597 A | 2/2004 |
| JP | 2001-505682 A | 4/2001 | | JP | 2004-505481 A | 2/2004 |
| JP | 2001-168628 A | 6/2001 | | JP | 2004-082775 A | 3/2004 |
| JP | 2001-188890 A | 7/2001 | | JP | 2004-88218 A | 3/2004 |
| JP | 2001-240046 A | 9/2001 | | JP | 2004-096566 A | 3/2004 |
| JP | 2001-256457 A | 9/2001 | | JP | 2004-253858 A | 9/2004 |
| JP | 2001-514777 A | 9/2001 | | JP | 2004-527864 A | 9/2004 |
| JP | 2001-319380 A | 11/2001 | | JP | 2004-280390 A | 10/2004 |
| JP | 2001-331976 A | 11/2001 | | JP | 2004-287767 A | 10/2004 |
| JP | 2001-332923 A | 11/2001 | | JP | 2004-297249 A | 10/2004 |
| JP | 2001-344574 A | 12/2001 | | JP | 2004-297681 A | 10/2004 |
| JP | 2001-351084 A | 12/2001 | | JP | 2004-319848 A | 11/2004 |
| JP | 2001-352176 A | 12/2001 | | JP | 2004-326380 A | 11/2004 |
| JP | 2002-024776 A | 1/2002 | | JP | 2004-334268 A | 11/2004 |
| JP | 2002-026513 A | 1/2002 | | JP | 2004-336250 A | 11/2004 |
| JP | 2002-042076 A | 2/2002 | | JP | 2004-343000 A | 12/2004 |
| JP | 2002-063557 A | 2/2002 | | JP | 2004-362190 A | 12/2004 |
| JP | 2002-505645 A | 2/2002 | | JP | 2004-362341 A | 12/2004 |
| JP | 2002-076750 A | 3/2002 | | JP | 2004-362602 A | 12/2004 |
| JP | 2002-76750 A | 3/2002 | | JP | 2005-124061 A | 5/2005 |
| JP | 2002-150245 A | 5/2002 | | JP | 2005-129019 A | 5/2005 |
| JP | 2002-157564 A | 5/2002 | | JP | 2005-136528 A | 5/2005 |
| JP | 2002-158529 A | 5/2002 | | JP | 2005-137032 A | 5/2005 |
| JP | 2002-175508 A | 6/2002 | | JP | 3653099 B2 | 5/2005 |
| JP | 2002-183690 A | 6/2002 | | JP | 2005-165839 A | 6/2005 |
| JP | 2002-185358 A | 6/2002 | | JP | 2005-167327 A | 6/2005 |
| JP | 2002-204117 A | 7/2002 | | JP | 2005-167813 A | 6/2005 |
| JP | 2002-522849 A | 7/2002 | | JP | 2005-190417 A | 7/2005 |
| JP | 2002-230128 A | 8/2002 | | JP | 2005-191705 A | 7/2005 |
| JP | 2002-252117 A | 9/2002 | | JP | 2005-210676 A | 8/2005 |
| JP | 2002-259934 A | 9/2002 | | JP | 2005-210680 A | 8/2005 |
| JP | 2002-298109 A | 10/2002 | | JP | 2005-217822 A | 8/2005 |
| JP | 2002-308437 A | 10/2002 | | JP | 2005-236339 A | 9/2005 |
| JP | 2002-319008 A | 10/2002 | | JP | 2005-244778 A | 9/2005 |
| JP | 2002-319009 A | 10/2002 | | JP | 2005-275870 A | 10/2005 |
| JP | 2002-319812 A | 10/2002 | | JP | 2005-284352 A | 10/2005 |
| JP | 2002-362613 A | 12/2002 | | JP | 2005-293537 A | 10/2005 |
| JP | 2002-373029 A | 12/2002 | | JP | 2005-295135 A | 10/2005 |
| JP | 2002-373323 A | 12/2002 | | JP | 2005-311205 A | 11/2005 |
| JP | 2002-374139 A | 12/2002 | | JP | 2005-321305 A | 11/2005 |
| JP | 2003-006599 A | 1/2003 | | JP | 2005-335755 A | 12/2005 |
| JP | 2003-016412 A | 1/2003 | | JP | 2005-346820 A | 12/2005 |
| JP | 2003-026177 A | 1/2003 | | JP | 2005-352858 A | 12/2005 |
| JP | 2003-030612 A | 1/2003 | | JP | 2006-025390 A | 1/2006 |
| JP | 2003-44789 A | 2/2003 | | JP | 2006-031766 A | 2/2006 |
| JP | 2003-046318 A | 2/2003 | | JP | 2006-39902 A | 2/2006 |
| JP | 2003-58840 A | 2/2003 | | JP | 2006-67479 A | 3/2006 |
| JP | 2003-067711 A | 3/2003 | | JP | 2006-72706 A | 3/2006 |
| JP | 2003-069335 A | 3/2003 | | JP | 2006-80367 A | 3/2006 |
| JP | 2003-076947 A | 3/2003 | | JP | 2006-92630 A | 4/2006 |
| JP | 2003-078336 A | 3/2003 | | JP | 2006-102953 A | 4/2006 |
| JP | 2003-085501 A | 3/2003 | | JP | 2006-107296 A | 4/2006 |
| JP | 2003-085520 A | 3/2003 | | JP | 2006-513594 A | 4/2006 |
| JP | 2003-87008 A | 3/2003 | | JP | 2006-148518 A | 6/2006 |
| JP | 2003-87044 A | 3/2003 | | JP | 2006-151402 A | 6/2006 |
| JP | 2003-099720 A | 4/2003 | | JP | 2006-174151 A | 6/2006 |
| JP | 2003-099721 A | 4/2003 | | JP | 2006-195795 A | 7/2006 |
| JP | 2003-110344 A | 4/2003 | | JP | 2006-203187 A | 8/2006 |

| | | | |
|---|---|---|---|
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-270212 A | 10/2006 |
| JP | 2006-270766 A | 10/2006 |
| JP | 2006-285911 A | 10/2006 |
| JP | 2006-302219 A | 11/2006 |
| JP | 2006-309401 A | 11/2006 |
| JP | 2006-323481 A | 11/2006 |
| JP | 2007-007888 A | 1/2007 |
| JP | 2007-043535 A | 2/2007 |
| JP | 2007-048126 A | 2/2007 |
| JP | 2007-65822 A | 3/2007 |
| JP | 2007-096768 A | 4/2007 |
| JP | 2007-122542 A | 5/2007 |
| JP | 2007-150868 A | 6/2007 |
| JP | 2007-159129 A | 6/2007 |
| JP | 4069958 B2 | 4/2008 |
| JP | 11-175678 A | 1/2009 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 02/061675 A1 | 8/2002 |
| WO | 02/097723 A1 | 12/2002 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/115849 A1 | 12/2005 |
| WO | 2006/045682 A | 5/2006 |
| WO | 2007/083574 A1 | 7/2007 |
| WO | 2007/125683 A1 | 11/2007 |
| WO | 2007/138857 A1 | 12/2007 |

OTHER PUBLICATIONS

Dokai et al.: "Wireless IC Device and Component for Wireless IC Device"; U.S. Appl. No. 12/359,690, filed Jan. 26, 2009.
Dokai et al.: "Test System for radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official communication issued in counterpart International Application No. PCT/JP2008/071502, mailed Feb. 24, 2009.
Kato et al.: "Wireless IC Device and Manufacturing Method Thereof,"; U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus", U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna", U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kataya et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.

Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.

Official communication issued in International Application No. PCT/JP2008/050356, mailed on Mar. 25, 2008.
Osamura et al.: "Packaging Material With Electromagnetic Coupling Module,"; U.S. Appl. No. 12/536,663, filed Aug. 6, 2009.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Official communication issued in International Application No. PCT/JP2008/054994, mailed on Jun. 3, 2008.

\* cited by examiner

WIRELESS IC DEVICE

BACKGROUND OF THE INVENTION

1. Field of the Invention

The present invention relates to wireless IC devices, and in particular, relates to wireless IC devices including wireless IC chips used in RFID (Radio Frequency Identification) systems.

2. Description of the Related Art

Recently, RFID systems enabling information transmission between readers/writers that generate induction fields and IC chips (also referred to as IC tags or wireless IC chips) that store predetermined information attached to, for example, articles and containers in a non-contact manner have been developed as systems for controlling articles. As a wireless IC device including an IC chip, a wireless IC device described in Japanese Unexamined Patent Application Publication No. 2005-136528 including a coiled antenna formed on a large-area film and an IC chip disposed so as to be in contact with the antenna is well known. This wireless IC device transmits/receives signals by coupling a magnetic flux generated by current flowing through the antenna when signals are sent from a driving circuit to the antenna and an antenna of a reader/writer.

However, the above-described wireless IC device according to the known technology disadvantageously has a narrow operating frequency band since the antenna is looped and connected to a matching circuit and the driving circuit at a central portion of the antenna and only signals of a single frequency determined by, for example, the line length of the coil are excited. Moreover, the wireless IC device may suffer communication failure when an electrical connection failure occurs due to deviation of the matching circuit and the coiled antenna from the connecting position. Furthermore, a magnetic flux is generated over or under the coiled antenna, but no magnetic flux is generated outside the magnetic flux leaking from the coil surface to the outer peripheral portion thereof. Therefore, the wireless IC device is made incommunicable even if the deviation of readers/writers and the antenna from each other is slight.

SUMMARY OF THE INVENTION

Accordingly, preferred embodiments of the present invention provide a wireless IC device operable in a wide band and suitable for RFID systems. Preferred embodiments of the present invention also provide a wireless IC device with excellent radiation characteristic and directivity. In addition, preferred embodiments of the present invention provide a wireless IC device including an electromagnetically coupled module and a radiating plate that are easily assembled.

According to a first preferred embodiment of the present invention, a wireless IC device includes a radiating plate including a linear electrode bent at a predetermined position so as to be apparently sectioned into two linear electrode portions having different lengths, both ends of the linear electrode being open; a wireless IC arranged to process transmitted/received signals; and a feeding circuit board including a feeding circuit that matches the impedance of the wireless IC with that of the radiating plate and/or sets the resonant frequencies of the transmitted/received signals. The wireless IC is coupled with the feeding circuit so as to define an electromagnetically coupled module. The electromagnetically coupled module is arranged such that the feeding circuit board and the two linear electrode portions of the radiating plate are electromagnetically coupled. The wireless IC is operated by signals received by the radiating plate, and response signals from the wireless IC are radiated outward from the radiating plate.

In the wireless IC device according to the first preferred embodiment of the present invention, the radiating plate includes the linear electrode bent at a predetermined position so as to be apparently sectioned into the two linear electrode portions having different lengths, and the electromagnetically coupled module is disposed such that the feeding circuit board and the two linear electrode portions of the radiating plate are electromagnetically coupled. As a result, the radiating plate functions as an antenna. Since the resonant frequency of the radiating plate can be set as appropriate for each linear electrode portion, a wide-band gain characteristic can be achieved.

Moreover, since the feeding circuit board and the radiating plate are electromagnetically coupled without being directly electrically connected, the wireless IC device can operate even when the electromagnetically coupled module is disposed adjacent to the radiating plate instead of being disposed on the radiating plate. In this manner, the electromagnetically coupled module does not need to be attached on the radiating plate with high accuracy, and the assembly process is markedly simplified.

According to a second preferred embodiment of the present invention, a wireless IC device includes a radiating plate including two linear electrode portions disposed side by side so as to form a helix, both ends of the linear electrode portions being open; and a wireless IC chip arranged to process transmitted/received signals. A terminal electrode of the wireless IC chip is electrically connected to each of the open ends of the linear electrode portions in a central portion of the helix.

In the wireless IC device according to the second preferred embodiment of the present invention, the radiating plate includes the two linear electrode portions disposed side by side so as to form a helix, and both ends of the linear electrode portions are open. Moreover, the terminal electrode of the wireless IC chip is electrically connected to each of the open ends of the radiating plate in the central portion of the helix. With this, the radiating plate functions as an antenna. Since the resonant frequency of the radiating plate can be set as appropriate for each linear electrode portion, a wide-band gain characteristic can be achieved.

The resonant frequencies of the linear electrode portions are primarily determined by the line lengths. When the two linear electrode portions are coiled up side by side so as to form a helix, the line lengths thereof change as the linear electrode portions are coiled up. Therefore, the resonant frequencies of the linear electrode portions become different from each other. However, even when the line lengths of the linear electrode portions adjacent to each other are the same, the resonant frequencies can be made different from each other by providing, for example, a difference between inter-electrode capacitances. That is, the inductances of the linear electrode portions vary by changing the line width of the electrode portions. In addition, the inter-electrode capacitances vary by changing the inter-electrode spacing.

According to a third preferred embodiment of the present invention, a wireless IC device includes a radiating plate including a linear electrode apparently sectioned into two linear electrode portions disposed side by side so as to form a double helix, both ends of the linear electrode being open; a wireless IC arranged to process transmitted/received signals; and a feeding circuit board including a feeding circuit that matches the impedance of the wireless IC with that of the radiating plate and/or sets the resonant frequencies of the transmitted/received signals. The wireless IC is coupled with the feeding circuit so as to define an electromagnetically coupled module. The electromagnetically coupled module is arranged such that the feeding circuit board and the two linear electrode portions of the radiating plate are electromagnetically coupled. The wireless IC is operated by signals received by the radiating plate, and response signals from the wireless IC are radiated outward from the radiating plate.

In the wireless IC device according to the third preferred embodiment of the present invention, the radiating plate includes the linear electrode apparently sectioned into the two linear electrode portions disposed side by side so as to form a helix, and the electromagnetically coupled module is arranged such that the feeding circuit board and the two linear electrode portions of the radiating plate are electromagnetically coupled. With this, the radiating plate functions as an antenna. As in the wireless IC device according to the first aspect, a wide-band gain characteristic can be achieved since the resonant frequency of the radiating plate can be set as appropriate for each linear electrode portion, and the assembly process is markedly simplified since the electromagnetically coupled module does not need to be attached on the radiating plate with high accuracy. In addition, the area occupied by the radiating plate can be small since the radiating plate is helical.

Moreover, since the two linear electrode portions are disposed side by side and coiled up into the helix in the same manner as those in the wireless IC device according to the second preferred embodiment, the line lengths of the linear electrode portions change as the linear electrode portions are coiled up. Thus, the resonant frequencies of the linear electrode portions differ from each other. However, even when the line lengths of the linear electrode portions adjacent to each other are the same, the resonant frequencies can be made different from each other by providing, for example, a difference between inter-electrode capacitances.

According to a fourth preferred embodiment of the present invention, a wireless IC device includes a radiating plate including a linear electrode apparently sectioned into two linear electrode portions disposed side by side so as to form a meandering shape, both ends of the linear electrode being open; a wireless IC that processes transmitted/received signals; and a feeding circuit board including a feeding circuit that matches the impedance of the wireless IC with that of the radiating plate and/or sets the resonant frequencies of the transmitted/received signals. The wireless IC is coupled with the feeding circuit so as to define an electromagnetically coupled module. The electromagnetically coupled module is arranged such that the feeding circuit board and the two linear electrode portions of the radiating plate are electromagnetically coupled. The wireless IC is operated by signals received by the radiating plate, and response signals from the wireless IC are radiated outward from the radiating plate.

In the wireless IC device according to the fourth preferred embodiment of the present invention, the radiating plate includes the linear electrode apparently sectioned into the two linear electrode portions disposed side by side so as to form a meandering shape, and the electromagnetically coupled module is disposed such that the feeding circuit board and the two linear electrode portions of the radiating plate are electromagnetically coupled. With this, the radiating plate functions as an antenna. As in the wireless IC device according to the first preferred embodiment, a wide-band gain characteristic can be achieved since the resonant frequency of the radiating plate can be set as appropriate for each linear electrode portion, and the assembly process is markedly simplified since the electromagnetically coupled module does not need to be attached on the radiating plate with high accuracy. In addition, the area occupied by the radiating plate can be small since the radiating plate meanders.

According to various preferred embodiments of the present invention, the resonant frequency of the radiating plate functioning as an antenna can be set differently for each two apparently sectioned linear electrode portions or for each linear electrode portion, resulting in a wide-band gain characteristic. Moreover, since the feeding circuit board and the radiating plate are electromagnetically coupled, the electromagnetically coupled module does not need to be attached on the radiating plate with high accuracy, and the assembly process is markedly simplified. Furthermore, the directivity can be arbitrarily set by extending the linear electrode portions outward from the helix.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
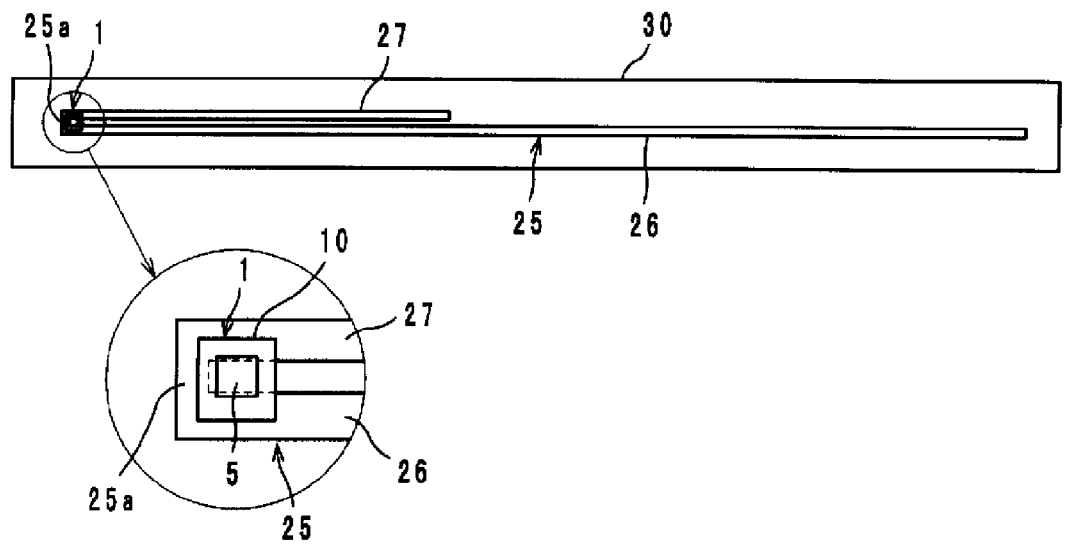
FIG. 1 is a plan view illustrating a wireless IC device according to a first preferred embodiment of the present invention.

Preferred embodiments of a wireless IC device according to the present invention will now be described with reference to the drawings. The same reference numbers and symbols are used for components or portions common in the drawings, and the duplicated descriptions will be omitted.

First Preferred Embodiment, See FIGS. 1 to 5B

FIG. 1 illustrates a wireless IC device according to a first preferred embodiment. This wireless IC device includes an electromagnetically coupled module 1 constituted by a wireless IC 5 arranged to process transmitted/received signals of predetermined frequencies and a feeding circuit board 10 on which the wireless IC 5 is mounted and a radiating plate 25 provided on a PET film 30.

The radiating plate 25 includes a linear electrode bent at a bent portion 25a so as to be apparently sectioned into two linear electrode portions 26 and 27. The lengths of the linear electrode portions 26 and 27 differ from each other, and both ends of the linear electrode are open. This radiating plate 25 preferably is a metal sheet composed of a conductive material such as aluminum or copper stuck on the film 30, or a plated metal film composed of, for example, Al, Cu, or Ag formed on the film 30, for example.

Figure 2:
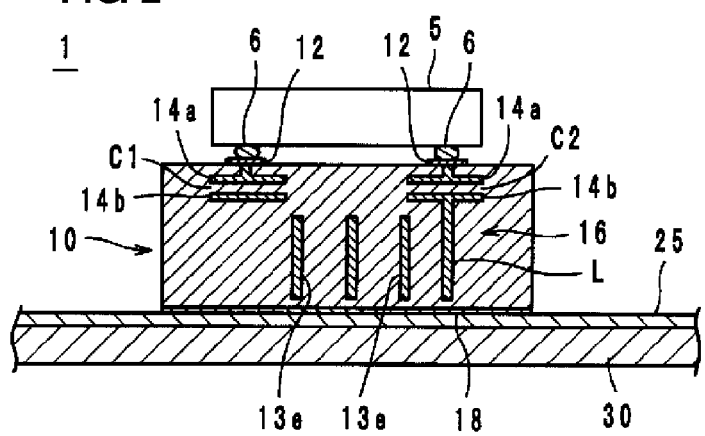
FIG. 2 is a cross-sectional view illustrating an electromagnetically coupled module.

As shown in FIG. 2 in detail, the electromagnetically coupled module 1 includes the wireless IC 5 and the feeding circuit board 10 on which the wireless IC 5 is mounted, and is stuck on the bent portion 25a of the radiating plate 25 using an adhesive 18, for example. It is desirable that the adhesive 18 be an insulator and have a high dielectric constant. The wireless IC 5 includes, for example, a clock circuit, a logic circuit, and a memory circuit; stores necessary information; and is electrically connected to a feeding (resonant) circuit 16 embedded in the feeding circuit board 10 via metal bumps 6. The metal bumps 6 can be composed of, for example, Au or solder.

Figure 3:
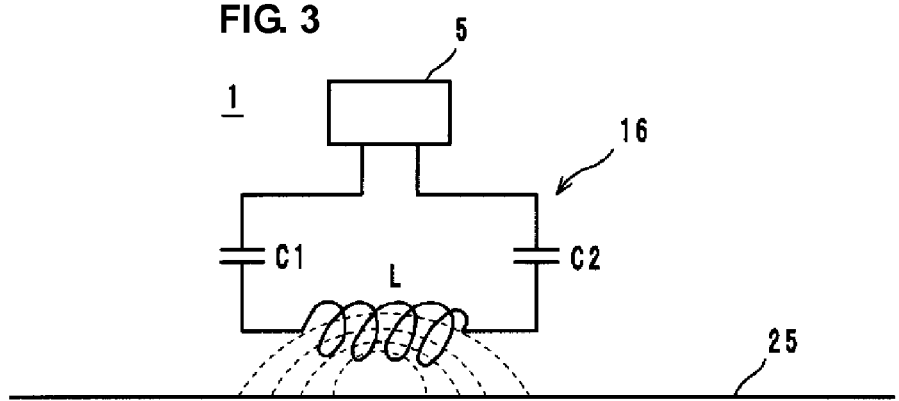
FIG. 3 is an equivalent circuit diagram of the electromagnetically coupled module.

The feeding circuit 16 supplies signals of predetermined frequency to be transmitted to the radiating plate 25, supplies signals of predetermined frequency selected from signals received by the radiating plate 25 to the wireless IC 5, and resonates with predetermined frequency. As shown in FIGS. 2 and 3, the feeding circuit 16 includes a lumped-constant LC series resonant circuit constituted by a helical inductance element L and capacitance elements C1 and C2. The inductance element L shown in FIGS. 2 and 3 are arranged such that the coil axis thereof is parallel or substantially parallel to the radiating plate 25. However, the coil axis can be perpendicular or substantially perpendicular to the radiating plate 25.

Figure 4:
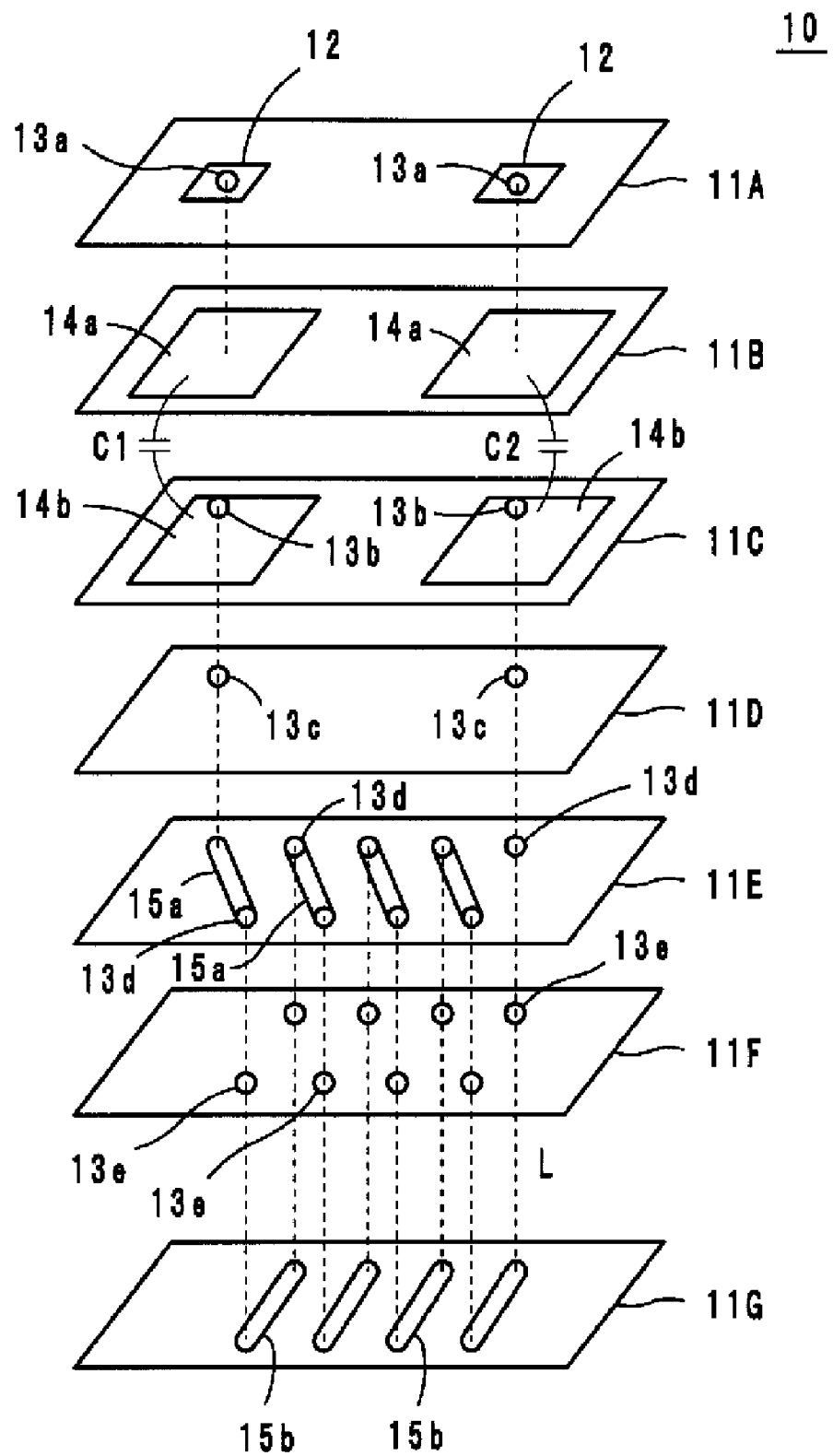
FIG. 4 is an exploded perspective view illustrating a feeding circuit board.

As shown in FIG. 4 in detail, the feeding circuit board 10 includes dielectric ceramic sheets 11A to 11G that are laminated, compacted, and fired. The ceramic sheet 11A includes connecting electrodes 12 and via conductors 13a. The ceramic sheet 11B includes capacitor electrodes 14a. The ceramic sheet 11C includes capacitor electrodes 14b and via conductors 13b. The ceramic sheet 11D includes via conductors 13c. The ceramic sheet 11E includes conductive patterns 15a and via conductors 13d. The ceramic sheet (or sheets) 11F includes via conductors 13e. The ceramic sheet 11G includes conductive patterns 15b. The ceramic sheets 11A to 11G can be composed of magnetic ceramics. The feeding circuit board 10 can be easily manufactured through known processes for producing multilayer substrates such as sheet lamination or thick-film screen printing.

The lamination of the sheets 11A to 11G forms the inductance element L whose helical coil axis is parallel or substantially parallel to the radiating plate 25, connects both ends of the inductance element L to the capacitor electrodes 14b, and forms the capacitance elements C1 and C2 including the capacitor electrodes 14a connected to the connecting electrodes 12 via the via conductors 13a. The connecting electrodes 12 serving as substrate electrode patterns are electrically connected to terminal electrodes (see FIGS. 5A and 5B) of the wireless IC 5 via the metal bumps 6.

That is, signals to be transmitted are supplied from the inductance element L serving as a coiled electrode pattern in the elements constituting the resonant circuit to the radiating plate 25 via a magnetic field, and conversely, signals received by the radiating plate 25 are supplied to the inductance element L via a magnetic field. Therefore, it is desirable that the inductance element L, among the inductance element L and the capacitance elements C1 and C2 that constitute the feeding circuit 16 in the feeding circuit board 10, be disposed closest to the radiating plate 25.

Figure 5A:
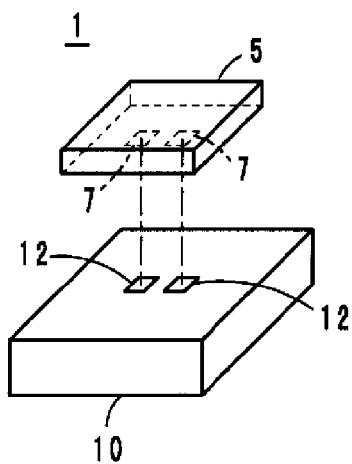
FIGS. 5A and 5B are perspective views illustrating connections between a wireless IC and the feeding circuit board.
Figure 5B:
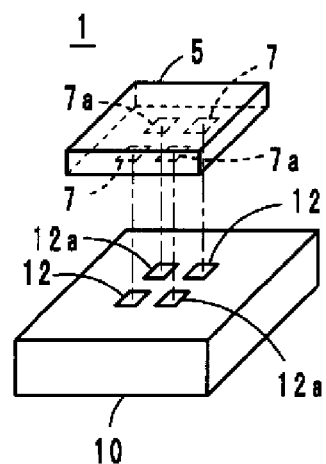

FIGS. 5A and 5B illustrate connections between the wireless IC 5 and the feeding circuit board 10. In FIG. 5A, the wireless IC 5 preferably has input-output terminal electrodes 7 on the back surface thereof, and the feeding circuit board 10 has the connecting electrodes 12 on the top surface thereof. In FIG. 5B illustrating another connection type, the wireless IC 5 preferably has the input-output terminal electrodes 7 and mounting terminal electrodes 7a on the back surface thereof, and the feeding circuit board 10 has the connecting electrodes 12 and 12a on the top surface thereof. The connecting electrodes 12a on the feeding circuit board 10 are terminated, and are not connected to other elements on the feeding circuit board 10.

FIG. 3 illustrates an equivalent circuit of the electromagnetically coupled module 1. This electromagnetically coupled module 1 receives high-frequency signals (for example, in the UHF band) radiated from readers/writers (not shown) using the radiating plate 25; resonates the feeding circuit 16 (LC series resonant circuit constituted by the inductance element L and the capacitance elements C1 and C2) primarily magnetically coupled with radiating plate 25; and supplies only received signals in a predetermined frequency band to the wireless IC 5. On the other hand, the electromagnetically coupled module 1 extracts a predetermined amount of energy from the received signals; matches the information stored in the wireless IC 5 to predetermined frequencies at the feeding circuit 16 using the energy as a driving source; and transmits signals to be transmitted from the inductance element L to the radiating plate 25 via magnetic coupling. The radiating plate 25 transmits and transfers the signals to readers/writers.

Herein, the wireless IC 5 was, for example, about 0.4 mm to about 0.9 mm in length, about 0.4 mm to about 0.9 mm in width, and about 50 μm to about 100 μm in thickness. The feeding circuit board 10 was larger than the wireless IC 5, and was up to about 3 mm in length, up to about 3 mm in width, and about 200 μm to about 500 μm in thickness, for example. The dimensions described above are given as an example only.

The feeding circuit 16 and the radiating plate 25 are coupled primarily via a magnetic field. However, the feeding circuit 16 and the radiating plate 25 can also be coupled via an electric field. In the present invention, "electromagnetic coupling" refers to coupling via an electric field and/or a magnetic field.

The resonant-frequency characteristic of the feeding circuit 16 is determined by the resonant circuit constituted by the inductance element L and the capacitance elements C1 and C2. The resonant frequency of signals radiated from the radiating plate 25 are substantially determined by self-resonant frequency of the feeding circuit 16. Therefore, the position at which the electromagnetically coupled module 1 is stuck does not need to be very accurately controlled, and the electromagnetically coupled module 1 can be stuck on the bent portion 25a or adjacent to the two linear electrode portions 26 and 27 so as to be electromagnetically coupled with the linear electrode portions 26 and 27.

Moreover, the radiating plate 25 includes the two apparently sectioned linear electrode portions 26 and 27, and the peaks of the resonant frequencies of the linear electrode portions 26 and 27 differ from each other since the relationship between the line length L and the resonant frequency $\lambda$ for each of the linear electrode portions 26 and 27 is represented by $L=\lambda/2$. Therefore, the wireless IC device according to various preferred embodiments of the present invention is operable in a wide band between the two peaks of the radiating plate 25. The operating band will be described with specific numerical values in the description of a fourth preferred embodiment (see FIGS. 8 and 9).

Furthermore, since the coil axis of the coiled electrode pattern constituting the inductance element L is parallel to the radiating plate 25, the central frequency of the inductance element L advantageously does not change. Moreover, since the capacitance elements C1 and C2 are disposed downstream of the wireless IC 5, surges in low frequencies can be cut by the capacitance elements C1 and C2, and the wireless IC 5 can be protected from the surges.

The feeding circuit 16 also serves as a matching circuit for matching the impedance of the wireless IC 5 with that of the radiating plate 25. The feeding circuit board 10 can include a matching circuit constituted by an inductance element and a capacitance element separately from the feeding circuit 16. Addition of the function of a matching circuit to the feeding circuit 16 may complicate the design of the feeding circuit 16. In the case that the matching circuit is separate from the feeding circuit 16, the resonant circuit and the matching circuit can be designed independently.

According to the first preferred embodiment described above, the frequencies of the transmitted/received signals are substantially determined by the resonant frequency of the feeding circuit 16 on the feeding circuit board 10, and the feeding circuit board 10 and the radiating plate 25 are electromagnetically coupled. Therefore, the electromagnetically coupled module 1 can be joined to the radiating plate 25 without highly accurate positioning, resulting in easy assembly. Moreover, the radiating plate 25 has an operating characteristic over a wide band, and the directivities of the linear electrode portions 26 and 27 can be aligned by arranging the linear electrode portions 26 and 27 side by side.

Figure 6:
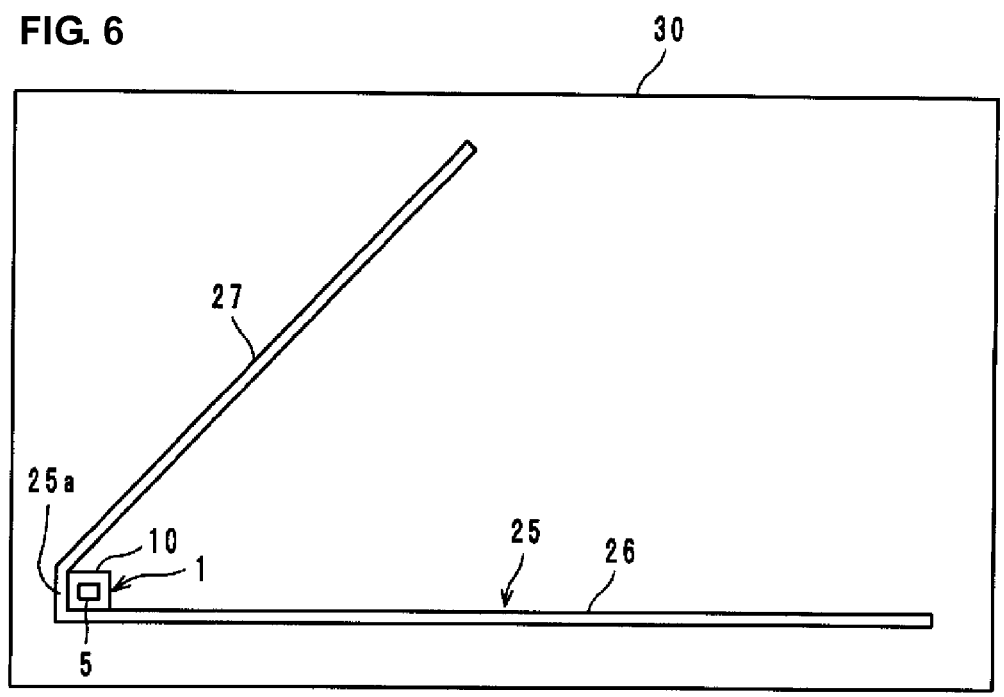
FIG. 6 is a plan view illustrating a wireless IC device according to a second preferred embodiment of the present invention.

Second Preferred Embodiment, FIG. 6

FIG. 6 illustrates a wireless IC device according to a second preferred embodiment. This wireless IC device basically has the same structure as that of the first preferred embodiment except that an open-ended radiating plate 25 is bent so as to be apparently sectioned into two linear electrode portions 26 and 27 with different lengths forming a predetermined angle (for example, about 45°) therebetween. Moreover, an electromagnetically coupled module 1 is disposed adjacent to a bent portion 25a of the radiating plate 25.

According to the second preferred embodiment, the radiating plate 25 also has an operating characteristic over a wide band including two peaks depending on the line lengths of the respective linear electrode portions 26 and 27, and the effects of the operating characteristic are the same as those of the first preferred embodiment. In particular, the radiating plate 25 has a radiation characteristic and a directivity depending on the angle formed between the two linear electrode portions 26 and 27.

Figure 7:
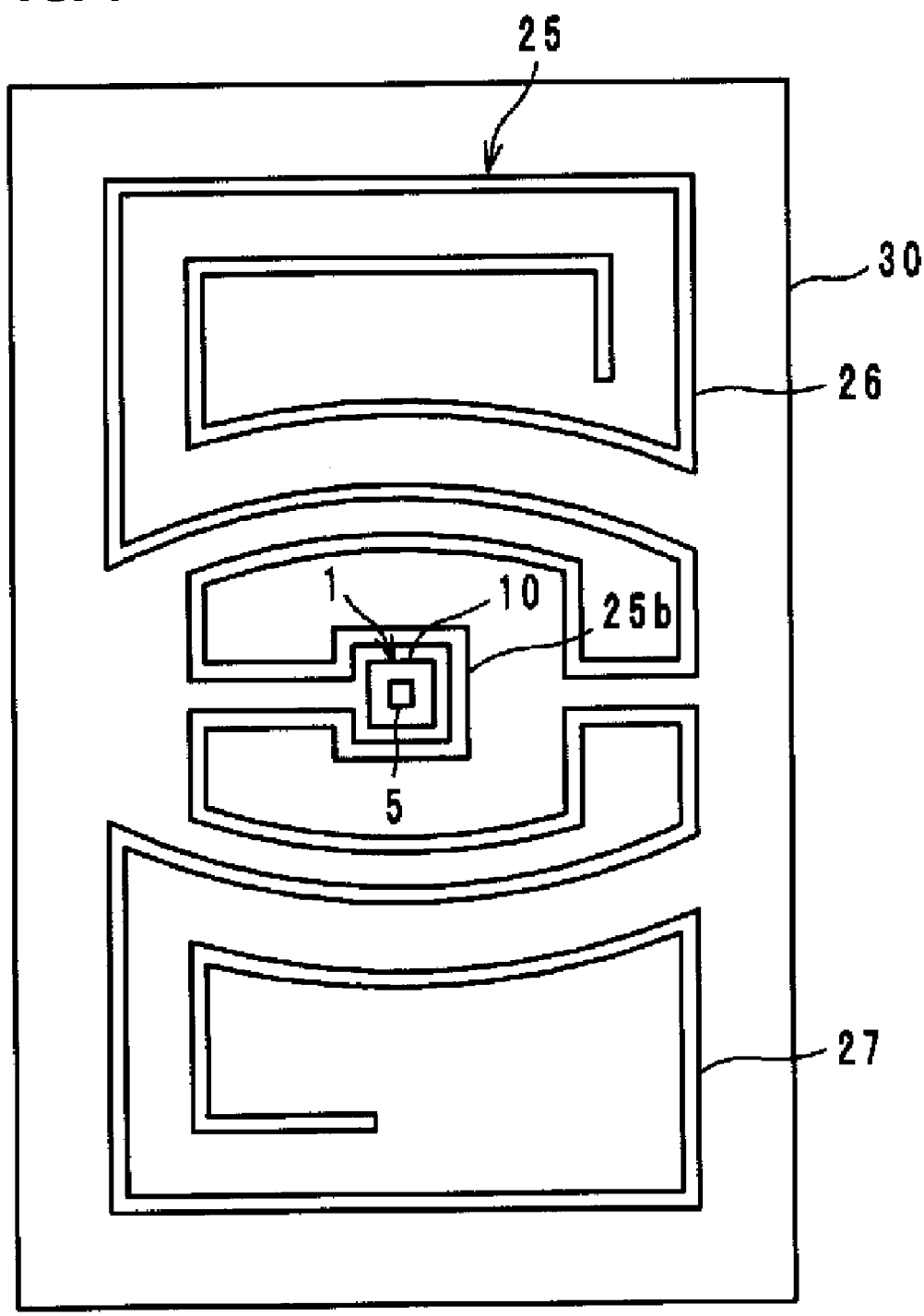
FIG. 7 is a plan view illustrating a wireless IC device according to a third preferred embodiment of the present invention.

Third Preferred Embodiment, FIG. 7

FIG. 7 illustrates a wireless IC device according to a third preferred embodiment. This wireless IC device basically has the same structure as that of the first preferred embodiment except that two linear electrode portions 26 and 27 with different lengths of an open-ended radiating plate 25 extend from a central portion 25b so as to form symmetrical meandering shapes. Moreover, an electromagnetically coupled module 1 is disposed in an area surrounded by the central portion 25b of the radiating plate 25.

According to the third preferred embodiment, the radiating plate 25 also has an operating characteristic over a wide band including two peaks depending on the line lengths of the respective linear electrode portions 26 and 27, and the effects of the operating characteristic are the same as those of the first preferred embodiment. In particular, since the two linear electrode portions 26 and 27 are arranged so as to form meandering shapes, the area occupied by the radiating plate 25 can be small.

Fourth Preferred Embodiment, See FIGS. 8 to 11

Figure 8:
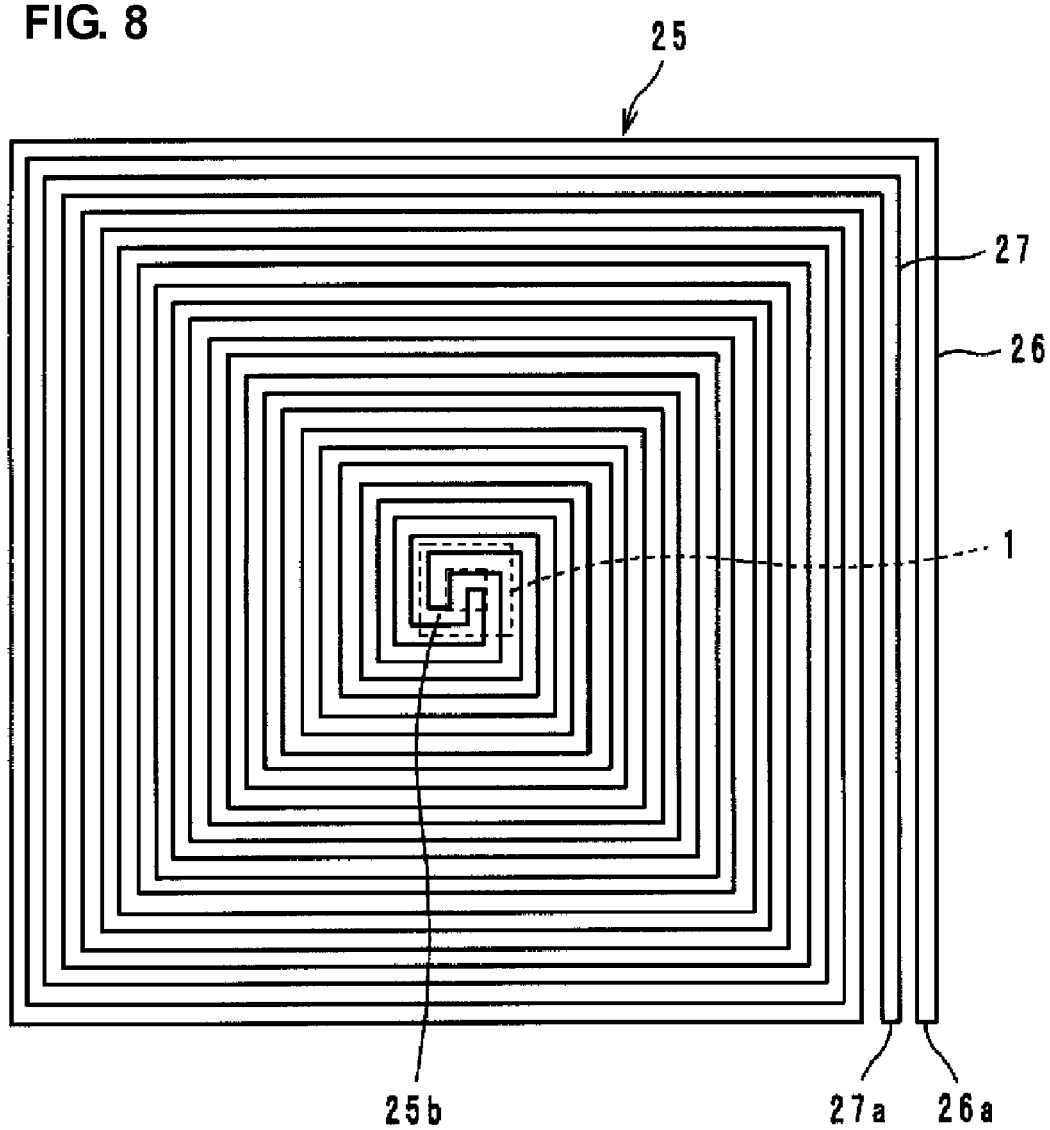
FIG. 8 is a plan view illustrating a wireless IC device according to a fourth preferred embodiment of the present invention.

FIG. 8 illustrates a wireless IC device according to a fourth preferred embodiment. This wireless IC device includes an electromagnetically coupled module 1 shown in the first preferred embodiment, and two linear electrode portions 26 and 27 of a radiating plate 25 extend from a central portion 25b side by side so as to form a helix. Ends 26a and 27a of the linear electrode portions 26 and 27, respectively, are open, and the positions of the open ends 26a and 27a are the same. The numbers of turns of the linear electrode portions 26 and 27 are the same. Moreover, the electromagnetically coupled module 1 is stuck on the central portion 25b of the radiating plate 25. Herein, a film 30 shown in FIG. 1 is not illustrated in FIG. 8.

Figure 9:
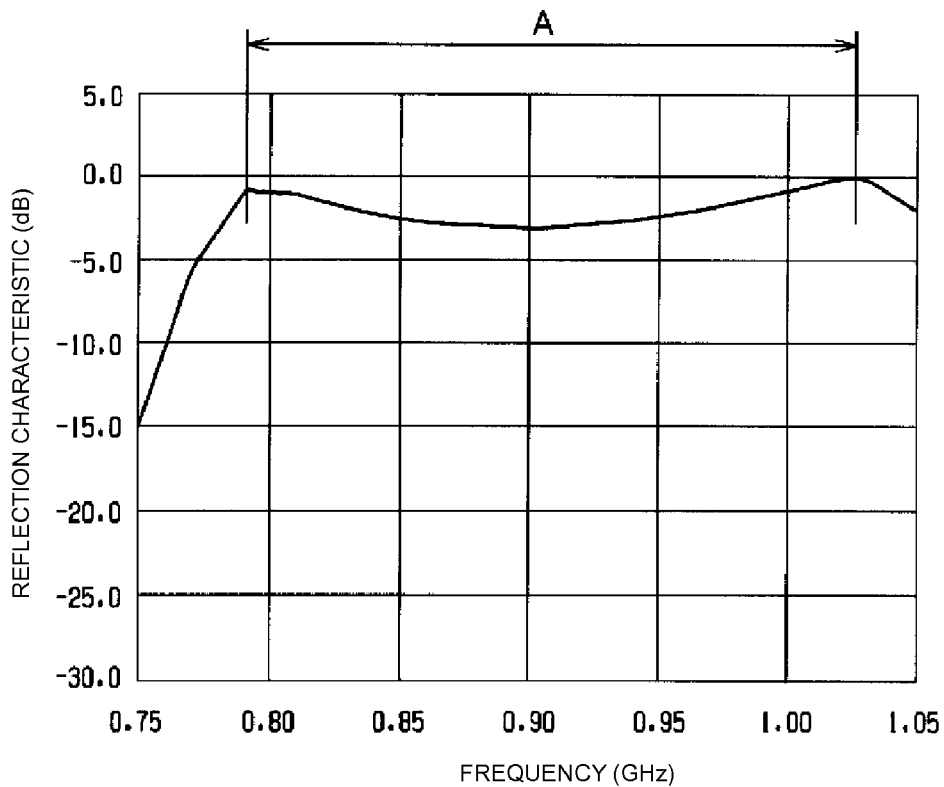
FIG. 9 illustrates the reflection characteristic according to the fourth preferred embodiment of the present invention.

Since the two linear electrode portions 26 and 27 of the radiating plate 25 are disposed side by side so as to form a helix in the fourth preferred embodiment, the line lengths of the linear electrode portions 26 and 27 change as the linear electrode portions 26 and 27 are coiled up. Therefore, the resonant frequencies of the linear electrode portions 26 and 27 differ from each other although currents passing through the linear electrode portions 26 and 27 are in phase and voltages applied to the linear electrode portions 26 and 27 are in phase. The relationship between the line length L and the wavelength $\lambda$ corresponding to the resonant frequency is represented by $L=\lambda/2$, and the peak values of the resonant frequencies of the linear electrode portions 27 and 26 were about 1.025 GHz and about 0.785 GHz, respectively, as shown in FIG. 9. Therefore, the radiating plate 25 is operable in a wide band A (see FIG. 9). Other effects are the same as those of the first preferred embodiment, and in particular, the area occupied by the radiating plate 25 can be small since the radiating plate 25 is helical.

In the fourth preferred embodiment, it is not necessary to dispose the electromagnetically coupled module 1 on the central portion 25b of the radiating plate 25, and can be disposed at any position, for example, on or adjacent to the two linear electrode portions 26 and 27 as long as the electromagnetically coupled module 1 is electromagnetically coupled with the linear electrode portions 26 and 27. The same applies to fifth to ninth preferred embodiments described below.

Figure 10:
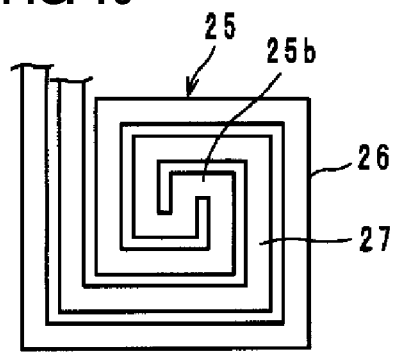
FIG. 10 is a plan view illustrating a modification of the fourth preferred embodiment of the present invention.
Figure 11:
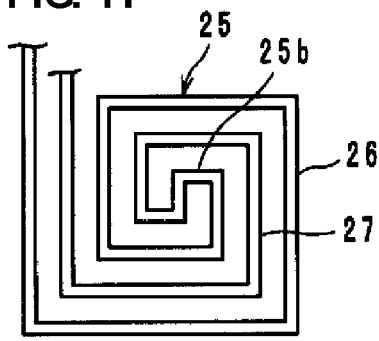
FIG. 11 is a plan view illustrating another modification of the fourth preferred embodiment of the present invention.

Even when the line lengths of the linear electrode portions 26 and 27 adjacent to each other are the same, the resonant frequencies can be made different from each other by providing, for example, a difference between inter-electrode capacitances. FIG. 10 illustrates an example in which the width of the lines is larger than that of a line-to-line spacing. Moreover, FIG. 11 illustrates an example in which the width of the line-to-line spacing is larger than that of the lines. The wireless IC is not illustrated in both examples.

In this manner, the inductances of the linear electrode portions 26 and 27 vary when the line width of the electrode portions is changed. That is, the inductances are increased by increasing the line width. Moreover, the inter-electrode capacitances vary when the inter-electrode spacing is changed. That is, the capacitances are reduced by increasing the inter-electrode spacing. Therefore, the resonant frequencies can be finely adjusted by changing the line width and/or the inter-electrode spacing.

Figure 12:
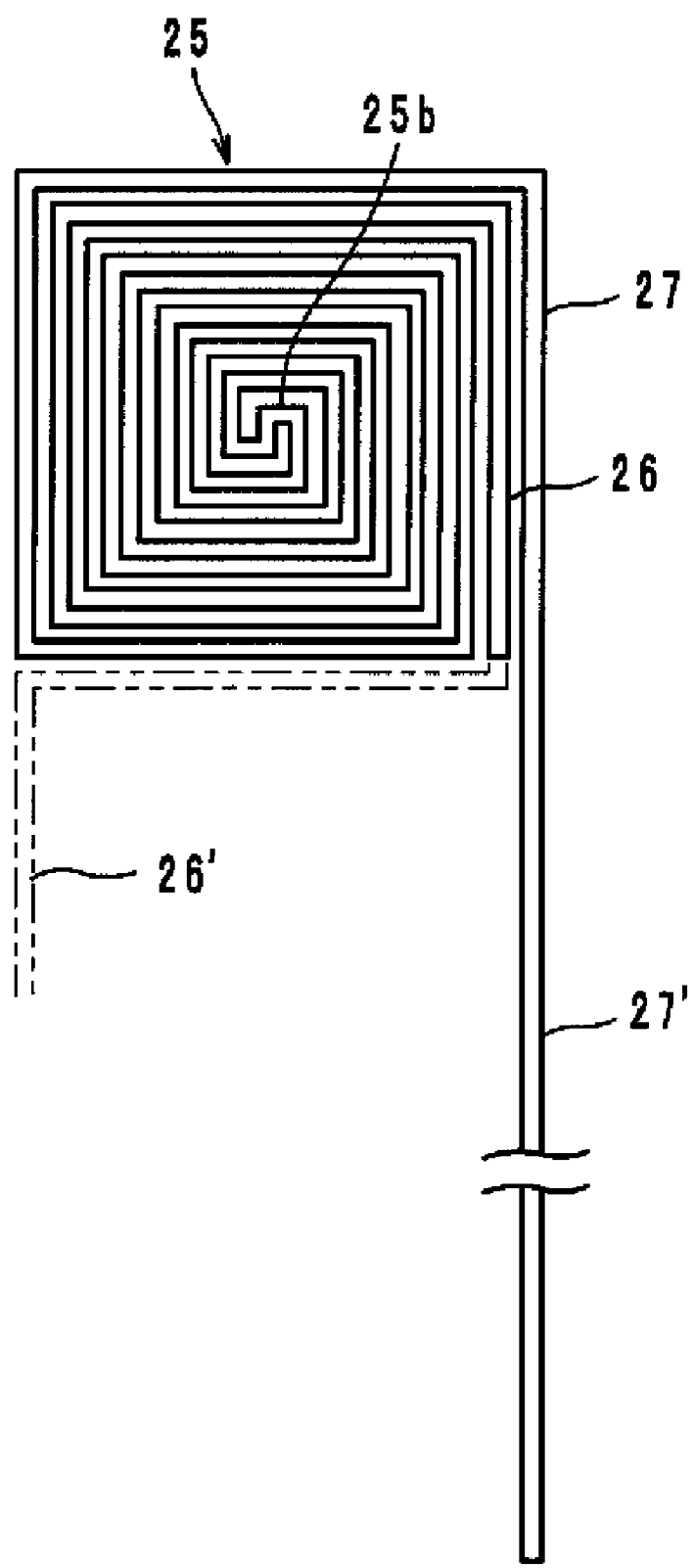
FIG. 12 is a plan view illustrating a wireless IC device according to a fifth preferred embodiment of the present invention.

Fifth Preferred Embodiment, See FIG. 12

FIG. 12 illustrates a wireless IC device according to a fifth preferred embodiment. This wireless IC device basically has the same structure as that of the fourth preferred embodiment except that a lead portion 27' extends outward from a linear electrode portion 27 of a radiating plate 25. An electromagnetically coupled module 1 and a film 30 shown in FIG. 1 are not illustrated in FIG. 12. The same applies to the sixth to eighth preferred embodiments described below.

The fifth preferred embodiment has the same effects as those of the fourth preferred embodiment, and in addition, the directivity of high-frequency signals can be set in a direction along which the lead portion 27' extends. Another lead portion (26') can also extend from a linear electrode portion 26 in the same direction as that of the lead portion 27'.

Currents passing through the linear electrode portions 26 and 27 adjacent to each other are in phase at specific coiled portions in the helix, and strong electromagnetic fields are generated at these portions since the magnetic fields reinforce each other. That is, currents passing through the linear electrode portions 26 and 27 are in phase at the central portion 25b, but become out of phase since the line lengths of the linear electrode portions 26 and 27 adjacent to each other become different from each other as the linear electrode portions 26 and 27 are coiled up. In-phase portions appear when the linear electrode portions 26 and 27 are further coiled up. Therefore, a large amount of energy can be extracted by extending the lead portion 27' (or the lead portion 26') from the in-phase portions where strong electromagnetic fields are generated, resulting in an excellent radiation characteristic.

Figure 13:
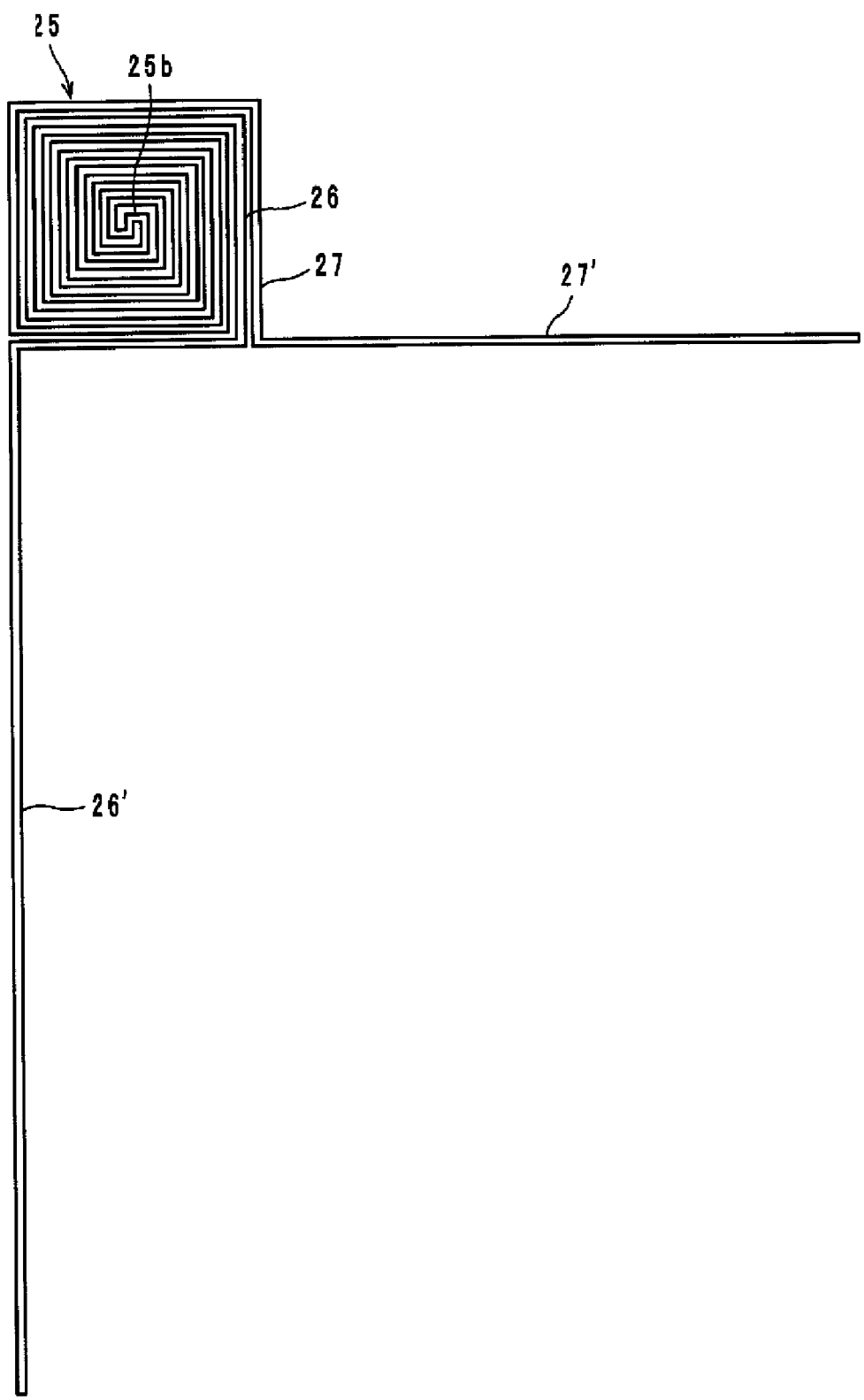
FIG. 13 is a plan view illustrating a wireless IC device according to a sixth preferred embodiment of the present invention.

Sixth Preferred Embodiment, See FIG. 13

FIG. 13 illustrates a wireless IC device according to a sixth preferred embodiment. This wireless IC device basically has the same structure as that of the fourth preferred embodiment except that lead portions 26' and 27' extend from linear electrode portions 26 and 27, respectively, of a radiating plate 25 so as to be perpendicular or substantially perpendicular to each other.

The sixth preferred embodiment has the same effects as those of the fourth and fifth preferred embodiments. In addition, circular polarized waves can be transmitted/received since directivities in the directions along which the lead portions 26' and 27' extend are synthesized.

Figure 14:
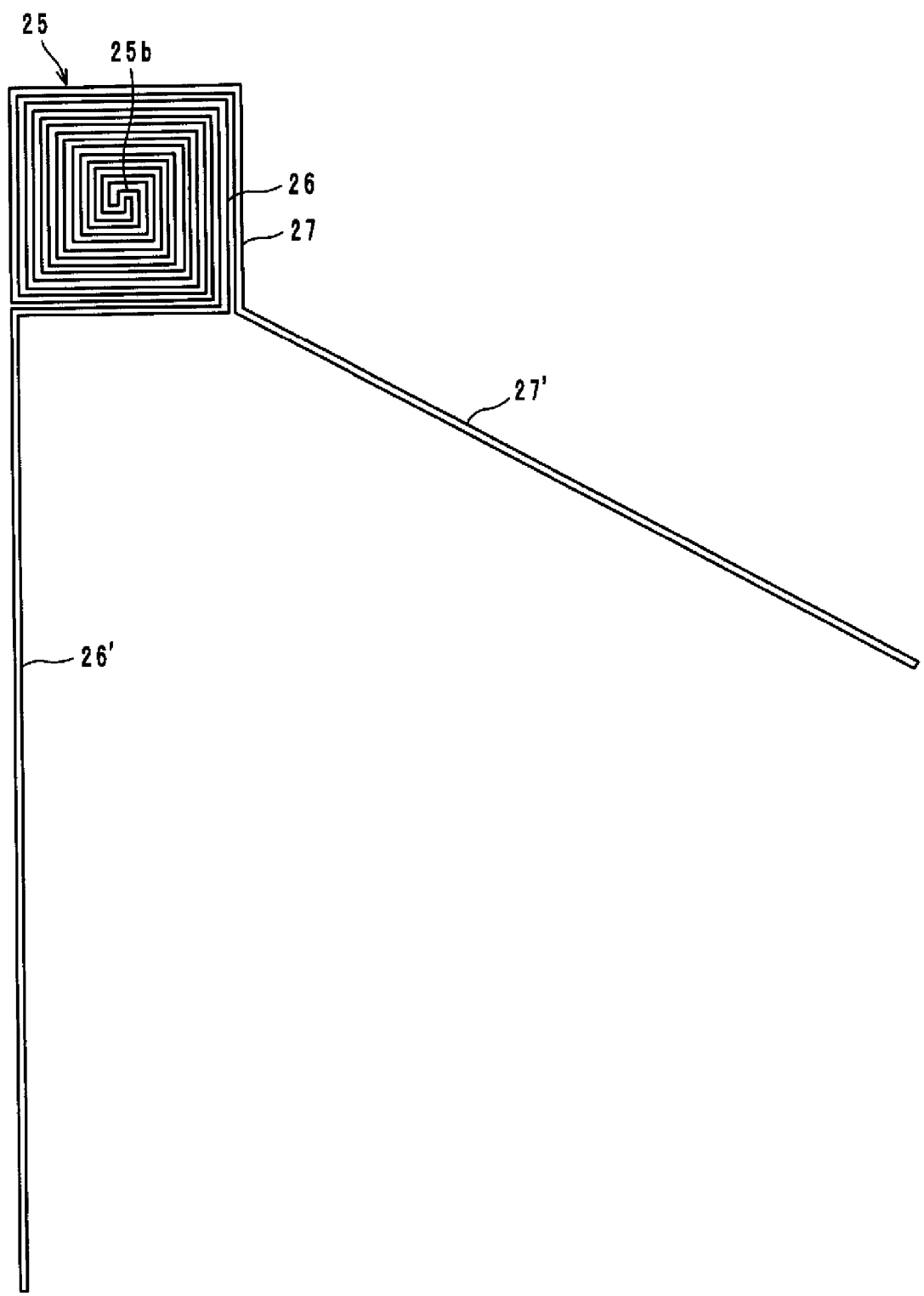
FIG. 14 is a plan view illustrating a wireless IC device according to a seventh preferred embodiment of the present invention.

Seventh Preferred Embodiment, FIG. 14

FIG. 14 illustrates a wireless IC device according to a seventh preferred embodiment. This wireless IC device basically has the same structure as that of the fourth preferred embodiment except that lead portions 26' and 27' extend from linear electrode portions 26 and 27, respectively, of a radiating plate 25 so as to form a predetermined angle therebetween, resulting in a directivity depending on the angle.

Figure 15:
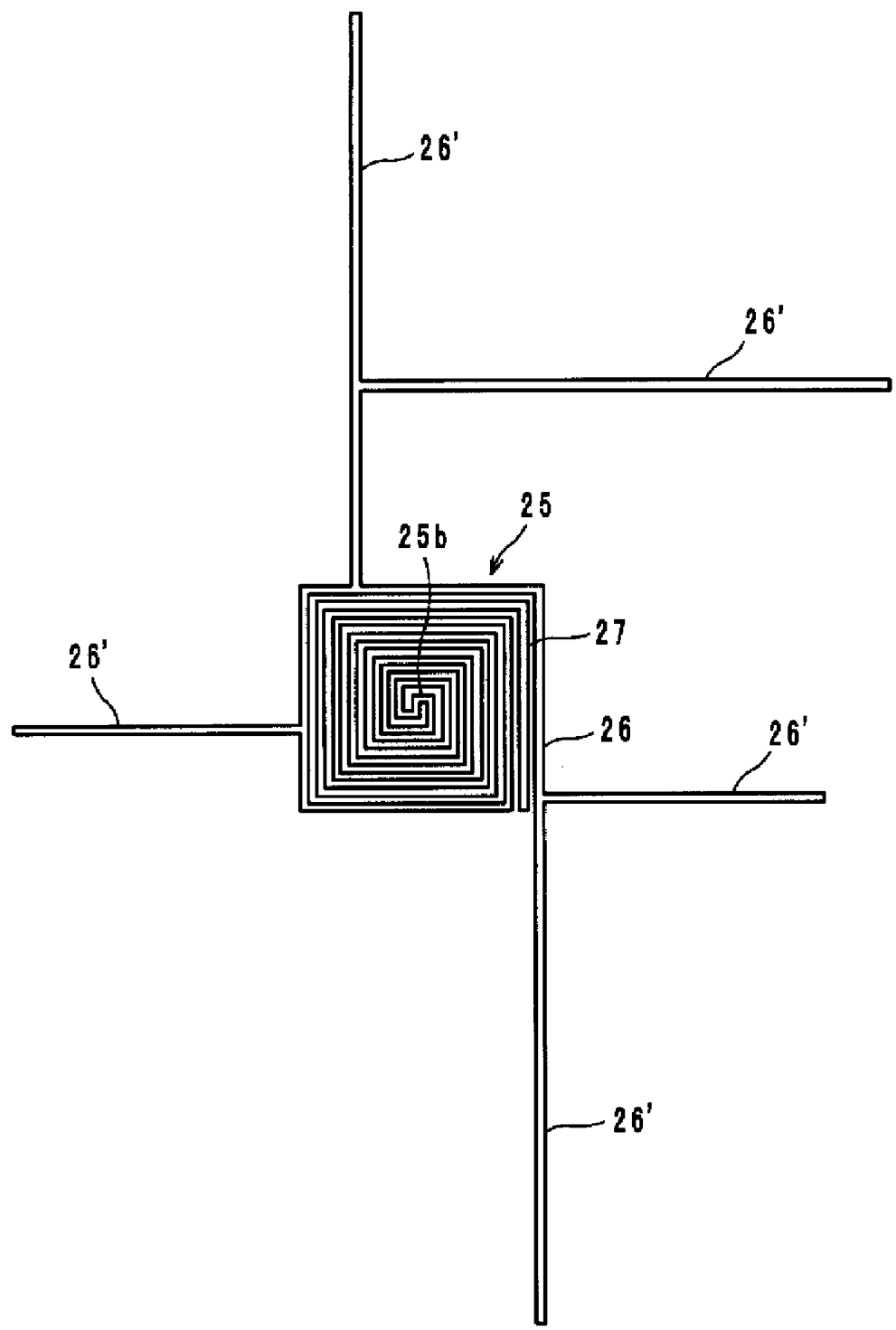
FIG. 15 is a plan view illustrating a wireless IC device according to an eighth preferred embodiment of the present invention.

Eighth Preferred Embodiment, FIG. 15

FIG. 15 illustrates a wireless IC device according to an eighth preferred embodiment. This wireless IC device basically has the same structure as that of the fourth preferred embodiment except that a plurality of lead portions 26' extend from a linear electrode portion 26 of a radiating plate 25, resulting in a directivity depending on directions along which the lead portions extend.

Figure 16:
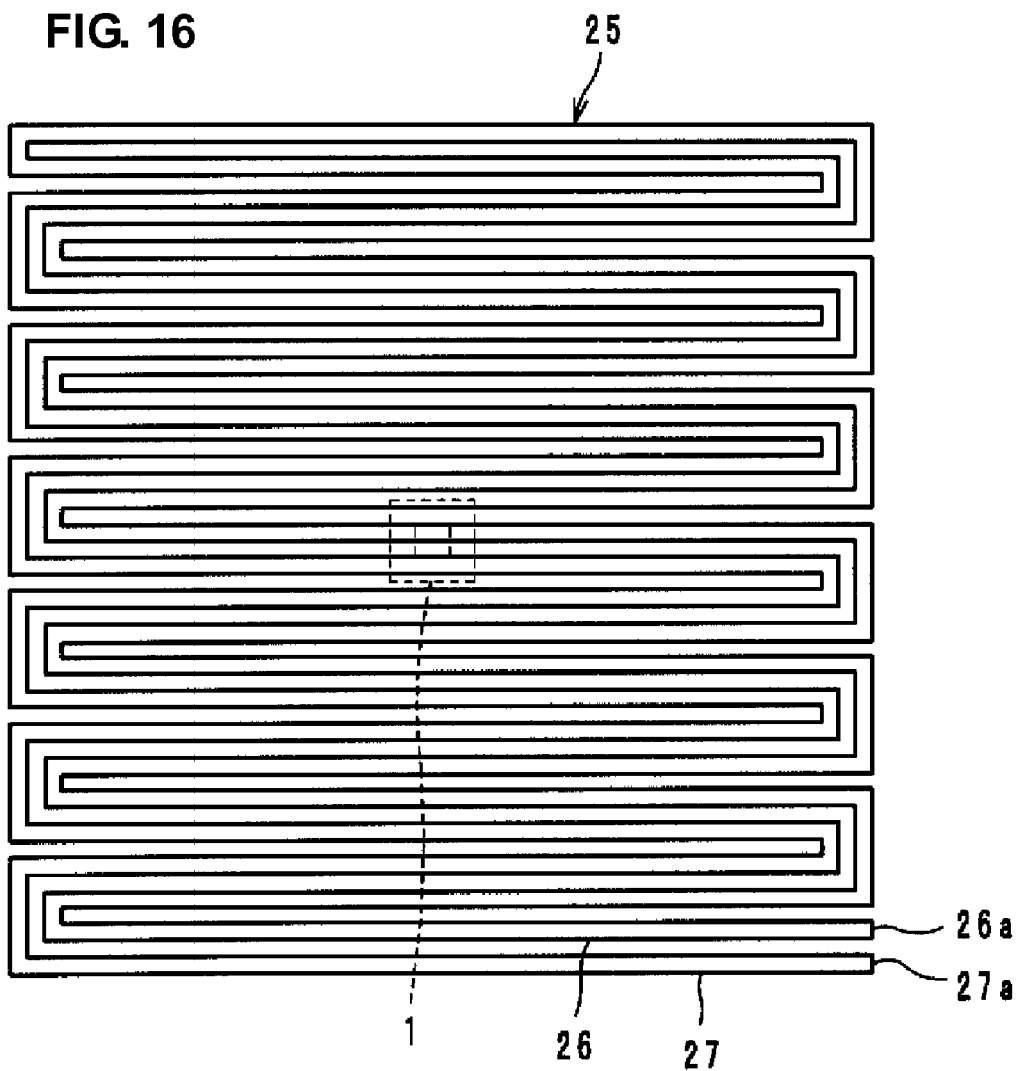
FIG. 16 is a plan view illustrating a wireless IC device according to a ninth preferred embodiment of the present invention.

Ninth Preferred Embodiment, FIG. 16

FIG. 16 illustrates a wireless IC device according to a ninth preferred embodiment. This wireless IC device includes an electromagnetically coupled module 1 shown in the first preferred embodiment, and a radiating plate 25 includes a linear electrode apparently sectioned into two linear electrode portions 26 and 27 extending side by side so as to form meandering shapes. Ends 26a and 27a of the linear electrode portions 26 and 27, respectively, are open. Moreover, the electromagnetically coupled module 1 is stuck on the central portion of the radiating plate 25 so as to extend over the linear electrode portions 26 and 27. Herein, a film 30 shown in FIG. 1 is not illustrated in FIG. 16.

Since the line lengths, i.e., the resonant frequencies of the linear electrode portions 26 and 27 of the radiating plate 25 also differ from each other for each two linear electrode portions in the ninth preferred embodiment, the radiating plate 25 is operable in a wide band. Other effects are the same as those of the first preferred embodiment, and in particular, the area occupied by the radiating plate 25 can be small since the radiating plate 25 meanders.

In the ninth preferred embodiment, it is not necessary to dispose the electromagnetically coupled module 1 on the central portion of the radiating plate 25, and can be disposed at any position, for example, on or adjacent to the two linear electrode portions 26 and 27 as long as the electromagnetically coupled module 1 is electromagnetically coupled with the linear electrode portions 26 and 27. Moreover, the resonant frequencies can also be adjusted by changing the line width or the inter-electrode spacing of the linear electrode portions 26 and 27.

Tenth Preferred Embodiment, FIGS. 17a to 20

Figure 17A:
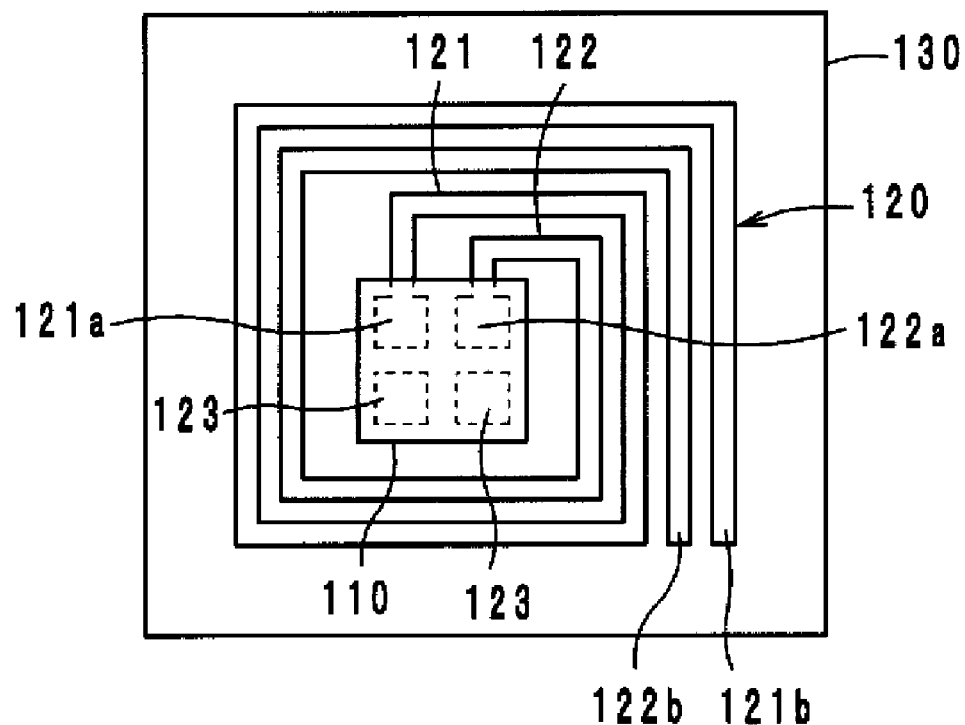
FIGS. 17A and 17B are a plan view and a cross-sectional view, respectively, illustrating a wireless IC device according to a tenth preferred embodiment of the present invention.
Figure 17B:
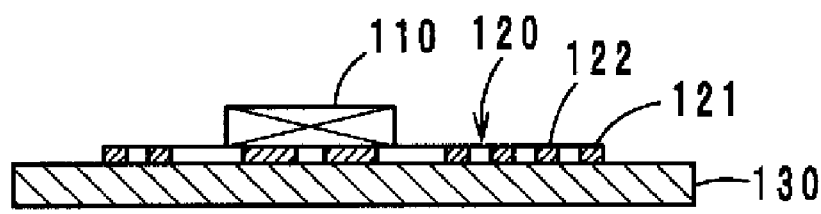

FIGS. 17A and 17B illustrate a wireless IC device according to a tenth preferred embodiment. This wireless IC device includes a wireless IC chip 110 that processes transmitted/ received signals of predetermined frequencies and a radiating plate 120 provided on a substrate 130 formed of a PET film.

The radiating plate 120 includes two linear electrode portions 121 and 122 disposed side by side so as to form helices. Both ends 121a and 121b of the linear electrode portion 121 and both ends 122a and 122b of the linear electrode portion 122 are open, and the open ends 121b and 122b are at the same position. The numbers of turns of the linear electrode portions 121 and 122 are the same. This radiating plate 120 is a metal sheet formed of a conductive component such as aluminum foil or copper foil stuck on the substrate 130 or an electrode film formed on the substrate 130 by plating a metal such as Al, Cu, or Ag or using, for example, conductive paste.

Figure 18:
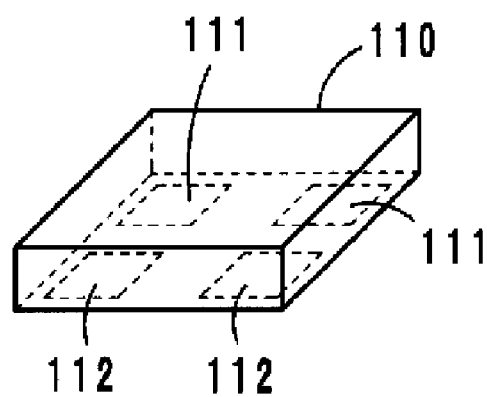
FIG. 18 is a perspective view illustrating a wireless IC chip.

The wireless IC chip 110 includes, for example, a clock circuit, a logic circuit, and a memory circuit, and stores necessary information. Input-output terminal electrodes 111 shown in FIG. 18 are electrically connected to the open ends 121a and 122a of the linear electrode portions adjacent to the center of the radiating plate via metal bumps composed of, for example, Au or solder. Moreover, connecting electrodes 123 are formed on the substrate 130, and are electrically connected to mounting terminal electrodes 112 of the wireless IC chip 110 via metal bumps.

The wireless IC device having the above-described structure is stuck on, for example, a container of an article serving as an object of RFID systems at the substrate 130 of the wireless IC device, and the wireless IC chip 110 communicates with readers/writers via the radiating plate 120 using, for example, high-frequency signals in the UHF band. The radiation characteristic of the antenna is substantially equal to that shown in FIG. 9.

Since the radiating plate 120 includes the two linear electrode portions 121 and 122 disposed side by side so as to form helices, the line lengths of the linear electrode portions 121 and 122 change as the linear electrode portions 121 and 122 are coiled up, and the resonant frequencies of the linear electrode portions 121 and 122 differ from each other. The relationship between the line length L and the wavelength λ corresponding to the resonant frequency is represented by L=λ/2, and the peak values of the resonant frequencies of the linear electrode portions 121 and 122 were about 0.785 GHz and about GHz, respectively, as shown in FIG. 9. Therefore, this wireless IC device is operable in a wide band A (see FIG. 9). Moreover, the area occupied by the radiating plate 120 can be small.

Figure 19:
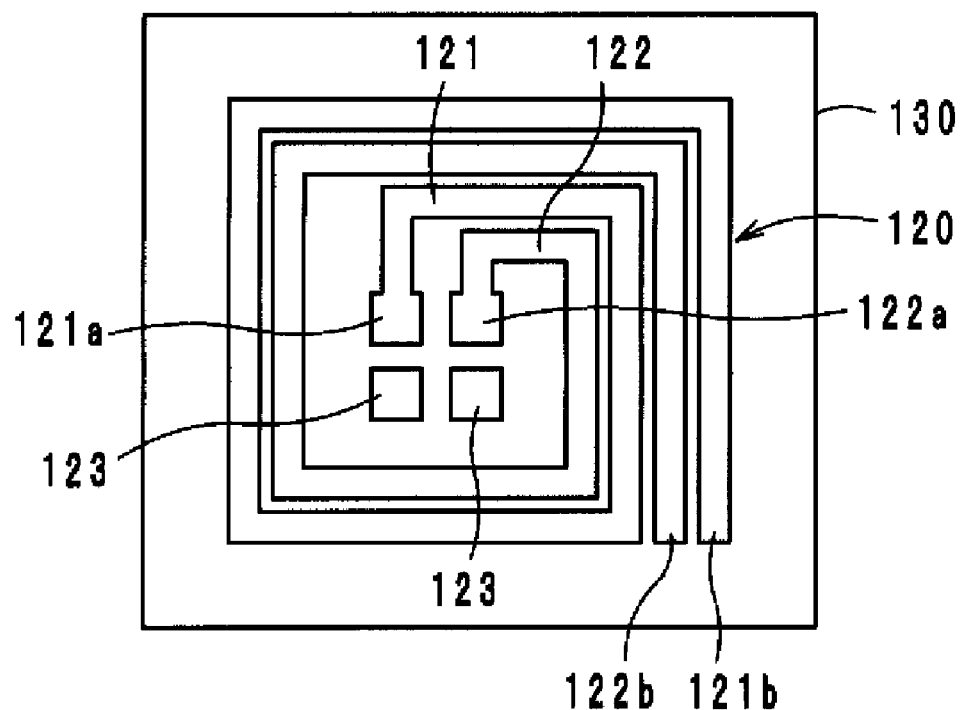
FIG. 19 is a plan view illustrating a modification of the tenth preferred embodiment of the present invention.
Figure 20:
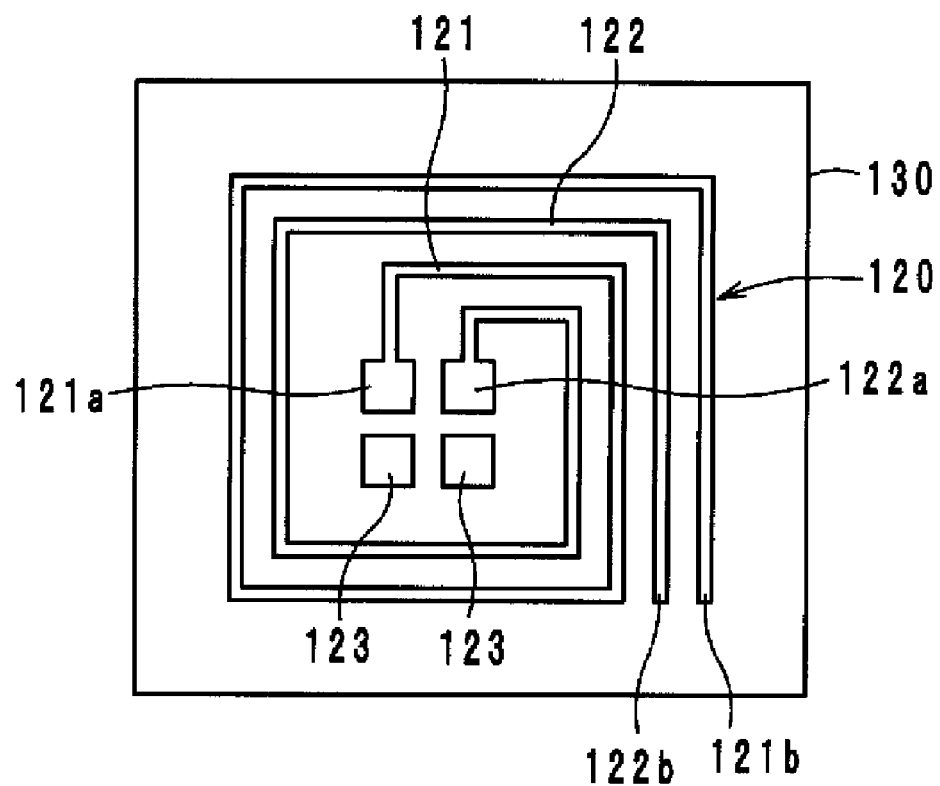
FIG. 20 is a plan view illustrating another modification of the tenth preferred embodiment of the present invention.

Even when the line lengths of the linear electrode portions 121 and 122 adjacent to each other are the same, the resonant frequencies can be made different from each other by providing, for example, a difference between inter-electrode capacitances. FIG. 19 illustrates a wireless IC device in which the width of the lines is larger than that of the line-to-line spacing. Moreover, FIG. 20 illustrates another wireless IC device in which the width of the line-to-line spacing is larger than that of the lines. The wireless IC chip is not illustrated in both the wireless IC devices.

In this manner, the inductances of the linear electrode portions 121 and 122 vary when the line width of the electrode portions is changed. That is, the inductances are increased by increasing the line width. Moreover, the inter-electrode capacitances vary when the inter-electrode spacing is changed. That is, the capacitances are reduced by increasing the inter-electrode spacing. Therefore, the resonant frequencies can be finely adjusted by changing the line width and/or the inter-electrode spacing.

Moreover, lead portions can also extend from the linear electrode portions 121 and 122 in any directions as shown in FIGS. 12, 13, and 14 in the tenth preferred embodiment. The effects of these lead portions have been described with reference to the fifth, sixth, and seventh preferred embodiments.

Summary of Preferred Embodiments

When a radiating plate includes linear electrode portions arranged so as to form a double helix, at least one of the linear electrode portions can extend outward from the helix. The radiation characteristic and directivity can be changed depending on directions along which the linear electrode portions extend outward, and as a result, circular polarized waves can be transmitted/received. Furthermore, the operating band can be increased by changing the lengths of the lead portions.

Moreover, it is preferable that currents passing through two adjacent linear electrode portions be in phase at the lead portions from which the linear electrode portions extend. As the linear electrode portions are coiled up into the helix, portions at which currents passing through the linear electrode portions adjacent to each other are in phase appear. A large amount of energy can be extracted by extending the linear electrode portions outward from these portions, resulting in an excellent radiation characteristic.

It is preferable that the feeding circuit board be formed of a multilayer substrate composed of, for example, ceramics or resin. With this, the size of the wireless IC device can be reduced. Moreover, the radiating plate can be disposed on a flexible substrate. With this, the wireless IC device can be stuck on articles with various shapes.

The wireless IC and the wireless IC chip can store rewritable information in addition to various types of information on articles on which the wireless IC device is to be stuck, and can have an information-processing function other than the RFID systems.

The wireless IC device of the present invention is not limited to the above-described preferred embodiments, and various modifications are possible within the scope of the present invention.

For example, the materials of the radiating plate and the film shown in the above-described preferred embodiments are given as an example only, and any materials can be used as long as the materials have necessary characteristics. Moreover, the wireless IC and the wireless IC chip can be joined to the feeding circuit by any processing other than using metal bumps.

Moreover, the lead portions of the radiating plate can have any shapes or dimensional ratios relative to the helix, and the numbers of turns of the linear electrode portions can also be arbitrarily set as a matter of course. Furthermore, the helix of the radiating plate is right-handed, but can be left-handed or can have two centers. In addition, the angles formed between the lead portions of the linear electrode portions can be arbitrarily set.

Moreover, the feeding circuit board can have any internal structure. The wireless IC chip can be connected to the radiating plate by any processing other than using metal bumps, and can be connected using, for example, an insulator. Moreover, the portion of the wireless IC can be integrated with the feeding circuit board. With this structure, the height of the wireless IC device can be reduced. The feeding circuit board can have only functions of matching the impedance of the wireless IC or the wireless IC chip with that of the radiating plate.

Preferred embodiments of the present invention relate to a wireless IC device, and has particular advantages of being operable in a wide band and suitable for RFID systems.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
a wireless IC arranged to process transmitted/received signals;
a feeder circuit connected to the wireless IC and including an inductance element;
a radiating plate coupled to the feeder circuit; wherein
the radiating plate includes a linear electrode that is bent at a predetermined position so as to be sectioned into two linear electrode portions;
the two linear electrode portions have different resonant frequencies, and at least one portion of each of the two linear electrode portions extend side by side with one another; and
the inductance element and each of the two linear electrode portions of the radiating plate are electromagnetically coupled to one another.

2. The wireless IC device according to claim 1, further comprising a feeder circuit board including the feeder circuit, wherein the feeding circuit board includes a multilayer substrate.

3. The wireless IC device according to claim 1, wherein the radiating plate is provided on a flexible substrate.

* * * * *